(12) United States Patent
Chen et al.

(10) Patent No.: US 7,819,979 B1
(45) Date of Patent: Oct. 26, 2010

(54) METHOD AND SYSTEM FOR CLEANING MAGNETIC ARTIFACTS USING A CARBONYL REACTIVE ION ETCH

(75) Inventors: Benjamin Chen, San Jose, CA (US); Yun-Fei Li, Fremont, CA (US); Hugh C. Hiner, Fremont, CA (US); Wei Zhang, Fremont, CA (US); Yingjian Chen, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 991 days.

(21) Appl. No.: 11/046,972

(22) Filed: Jan. 31, 2005

(51) Int. Cl.
*B08B 7/00* (2006.01)
*B08B 7/04* (2006.01)

(52) U.S. Cl. .............. 134/1.1; 134/1; 134/26; 134/30; 134/1.2

(58) Field of Classification Search ............ 134/1, 134/1.1, 1.2, 1.3, 26, 30; 216/22, 58; 438/3, 438/706, 707, 734
See application file for complete search history.

(56) References Cited

U.S. PATENT DOCUMENTS

| | | | |
|---|---|---|---|
| 7,015,524 B2 * | 3/2006 | Ikeda | 257/295 |
| 7,105,361 B2 * | 9/2006 | Chen et al. | 438/3 |
| 7,205,164 B1 * | 4/2007 | Geha et al. | 438/3 |
| 2004/0173568 A1 * | 9/2004 | Hattori | 216/22 |
| 2005/0067371 A1 * | 3/2005 | Okawa et al. | 216/12 |
| 2005/0161427 A1 * | 7/2005 | Okawa et al. | 216/20 |
| 2006/0166506 A1 * | 7/2006 | Okawa et al. | 438/706 |

FOREIGN PATENT DOCUMENTS

| JP | 11092971 A | * | 4/1999 |
| JP | 2000322710 A | * | 11/2000 |
| JP | 2001274144 A | * | 10/2001 |

OTHER PUBLICATIONS

I. Nakatani, "Ultramicro Fabrications on Fe-Ni Alloys Using Electron-Beam Writing and Reactive-Ion-Etching," IEEE Trans. Magn. 32, No. 5, pp. 4448-4451, 1996.

* cited by examiner

*Primary Examiner*—Alexander Markoff

(57) ABSTRACT

A method and system for providing a magnetic structure that includes at least one magnetic material is disclosed. The method and system include defining the magnetic structure. The magnetic structure also includes a top layer that is insensitive to an istroropic carbonyl reactive ion etch. The defining of the magnetic structure results in at least one artifact. The method and system further includes cleaning the at least one artifact using at least one isotropic carbonyl reactive ion etch.

30 Claims, 7 Drawing Sheets

METHOD AND SYSTEM FOR CLEANING MAGNETIC ARTIFACTS USING A CARBONYL REACTIVE ION ETCH

FIELD OF THE INVENTION

The present invention relates to magnetic recording technology, and more particularly to a method and system for cleaning processing artifacts on magnetic structures.

BACKGROUND OF THE INVENTION

FIG. 1 depicts a conventional magnetic structure 10. The conventional magnetic structure 10 depicted is a spin valve that exhibits giant magnetoresistance. The conventional magnetic structure 10 includes a seed layer 12, an antiferromagnetic (AFM) layer 14, a pinned layer 16, a conventional spacer layer 18, a conventional free layer 20, and a capping layer 22. The conventional pinned layer 18 and the conventional free layer 20 are typically ferromagnetic. The conventional magnetic structure 10 is typically used for reading data.

FIG. 2 depicts a conventional method 50 for providing the conventional magnetoresistive structure 10. Referring to FIGS. 1 and 2, the layer(s) 12, 14, 16, 18, 20, and 22 for the conventional magnetic structure are fabricated, via step 52. The conventional magnetic structure 10 is then defined from the layers, via step 54. Step 54 thus includes forming a mask (not shown) on the top layer 22 of the magnetic structure 10 and transferring the pattern of the mask to the layers 12, 14, 16, 18, 20, and 22 of the conventional magnetic structure 10. For structures such as spin valves, step 54 is typically accomplished through ion milling. In particular, a bilayer photoresist pattern (not shown) is typically fabricated on the top layer 22 of the magnetic structure. Ion beam milling is performed with the bilayer photoresist structure in place. The bilayer photoresist structure is then lifted off. Consequently, the conventional magnetic structure 10 is defined. Note that other methods, such as anisotropic reactive ion etching (RIE) using chemistries such as a carbonyl chemistry have been proposed. Like ion beam milling, such methods are anisotropic in nature, removing substantially more material vertically than in the plane of the layers 12, 14, 16, 18, 20, and 22. Consequently, the pattern of the mask is transferred to the underlying layers and the conventional magnetic structure 10 defined. Processing is then completed, via step 56. Step 56 typically includes filling the regions around the conventional magnetic structure 10 with other materials, such as nonmagnetic insulators or hard magnets, as well as providing a top shield.

The conventional method 50 depicted in FIG. 2 sometimes results in a device having poor performance and/or reliability. FIG. 3 depicts a close up view of a portion of the conventional magnetic structure 10 and, for clarity, is not drawn to scale. This close up view displays examples of some processing artifacts resulting from use of the conventional method 50 in forming a spin valve. Because the magnetic structure 10 is defined using ion milling or a like process in the step 54 of the method 50, the conventional magnetic structure 10 may include artifacts 32, 34, 36, and 38. The artifacts 32, 34, 36, and 38 include redeposition 32 and 36 as well as fencing 34 and 38. Redeposition 32 and 36 is typically at least twenty-five Angstroms in thickness. Redeposition 32 and 36 occurs because portions of the layers of the magnetic structure 10 that are being removed can redeposit back onto the conventional magnetic structure 10 during the ion milling or like technique. Fencing 34 and 38 results from materials removed being redeposited against the bilayer mask during ion milling. When ion milling is completed and the bilayer mask removed, the fencing 34 and 38 can be left behind. Fencing 34 and 38 might be over one hundred Angstroms thick.

The conventional magnetic structure 10 suffers from certain drawbacks. For example, because of the presence of the artifacts 32, 34, 36, and 38 the spacing between a conductive shield (not shown) and the conventional magnetic structure 10 varies. Thus, the conventional magnetic structure 10 is subject to shorting, for example between the magnetic structure 10 and the shield. Consequently, performance and reliability may be compromised. In addition, the artifacts 32, 34, 36, and 38 may shunt current away from the sensing layers 16, 18, and 20. As a result, signal would be reduced. Performance of the conventional magnetic structure 10 is thus compromised.

Accordingly, what is needed is a method and system for providing a magnetic structure having improved performance and/or reliability.

DETAILED DESCRIPTION OF THE INVENTION

Figure 1:
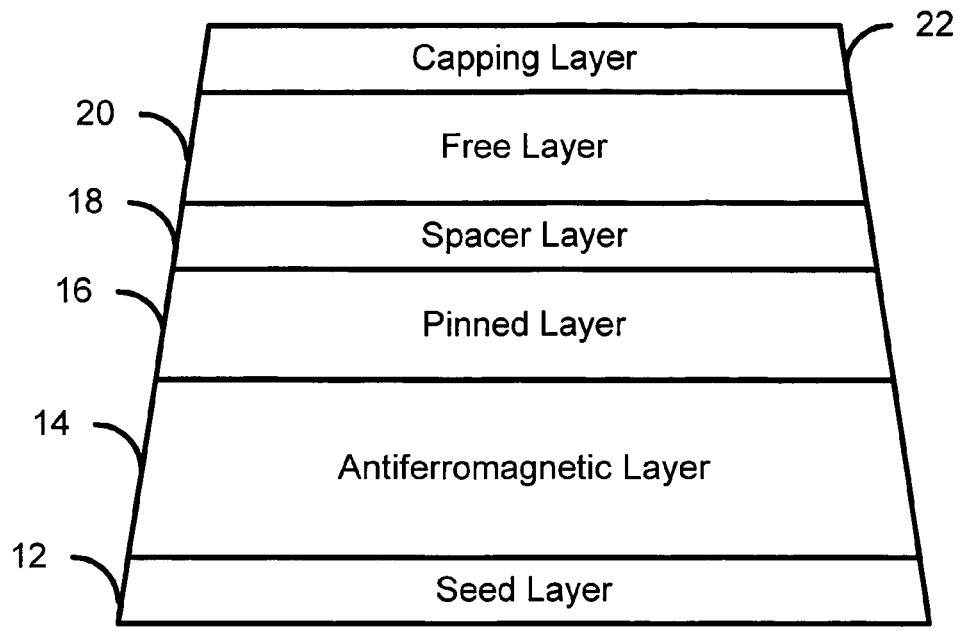
FIG. 1 is a diagram of a conventional magnetic structure.
Figure 2:
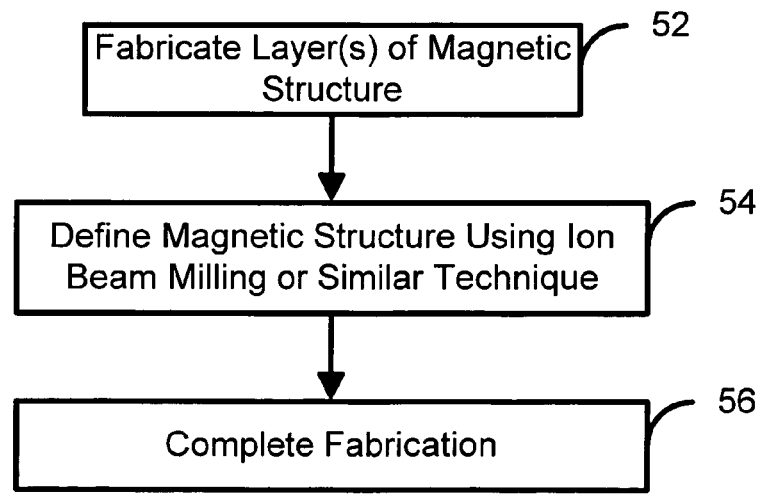
FIG. 2 is a flow chart depicting a conventional method for fabricating the conventional magnetic structure.
Figure 3:
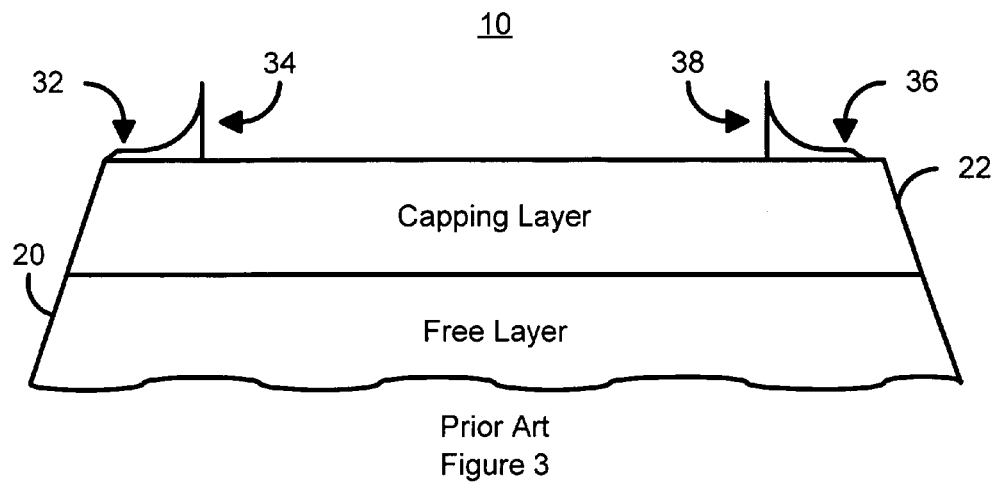
FIG. 3 is a close up view of a portion of the conventional magnetic structure, illustrating certain artifacts resulting from fabrication.
Figure 4A:
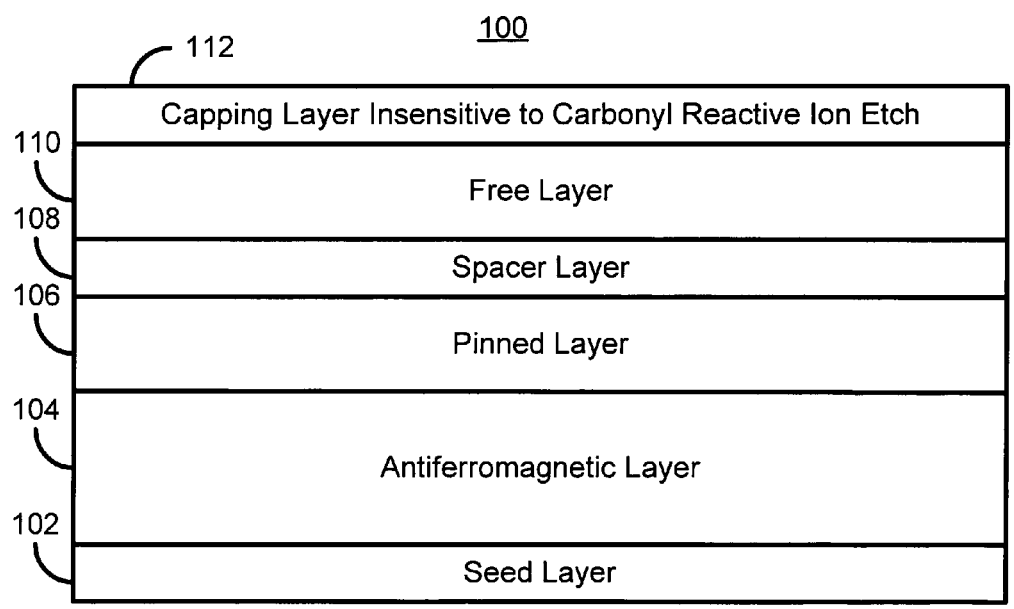
FIGS. 4A-4F depict a magnetic structure formed in accordance with an exemplary embodiment of the present invention.

FIGS. 4A-4F depict a magnetic structure 100 formed in accordance with an exemplary embodiment of the present invention. The magnetic structure 100 is a spin valve. However, the method and system of the present invention may be used with other magnetic structures and other applications including, but not limited to, tunneling magnetoresistive junctions and magnetic random access memories. Furthermore, for clarity, FIGS. 4A-4F are not drawn to scale. Referring to FIG. 4A, the magnetic structure 100 is from a number of layers, at least one of which includes a magnetic material. In the embodiment of the magnetic structure 100 shown, the layers include a seed layer 102, an AFM layer 104, a pinned layer 106, a spacer layer 108, a free layer 110 and a capping layer 112. The pinned layer 106 and free layer 110 are magnetic. The spacer layer 108 is a thin, nonmagnetic conductor. The capping layer 112 is the top layer of the magnetic structure 100 and is insensitive to an isotropic carbonyl reactive ion etch (RIE). In a preferred embodiment, the capping layer 112 includes Ta. Also in a preferred embodiment, the Ta capping layer 112 includes a natural Ta oxide layer formed at its top surface. Alternatively, the top layer 112 may include W and Ti. The layers 102, 104, 106, 108, 110, and 112 may actually include multiple layers. For example, the free layer 110 may be a synthetic layer including ferromagnetic layers having nonmagnetic conductive layers therebetween. Furthermore, a different ordering of the layers may be used. For example, the free layer 110 might be the bottom layer after any seed layer(s), followed by a spacer layer 108, a pinned layer 106, an AFM layer 104, and the capping layer 112. In addition, other magnetic structures (not shown) may include different and/or additional layers.

Figure 4B:
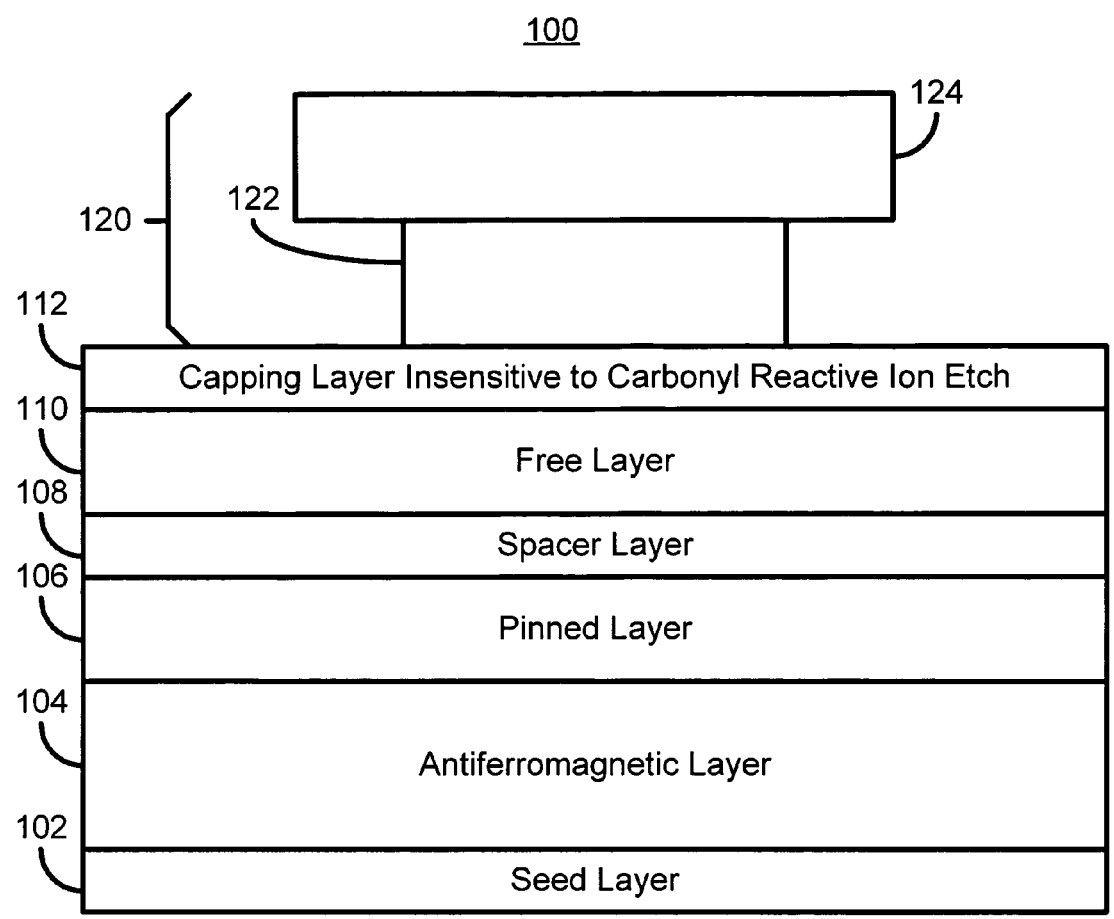

FIG. 4B depicts the magnetic structure 100 after a mask 120 has been formed. Because the magnetic structure 100 depicted is the spin valve 100, the mask 120 is a bilayer structure including undercut portion 122 and top portion 124. Because of the shape of the mask 120, the resulting magnetic structure 100 will have a desired profile.

Figure 4C:
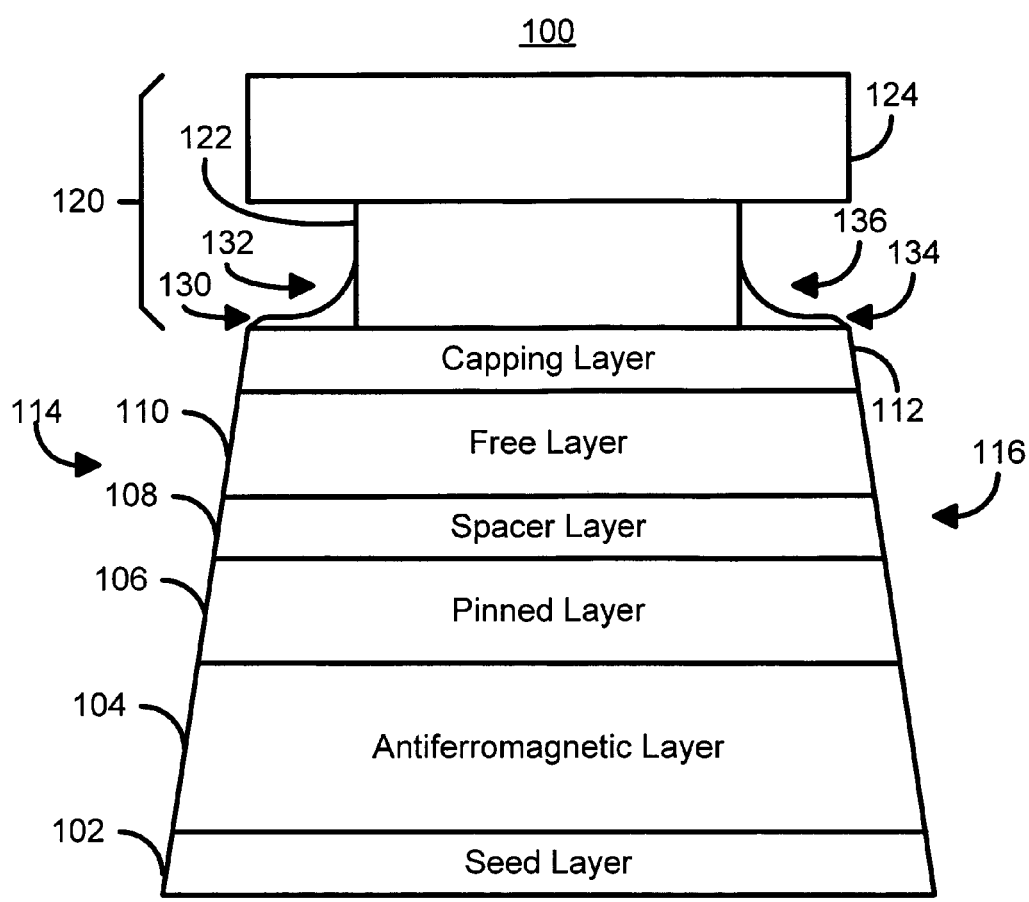

FIG. 4C depicts the magnetic structure 100 after definition, preferably using ion beam milling, and prior to liftoff of the mask 120. Defining the magnetic structure 100 removes portions of the layers 102, 104, 106, 108, 110, and 112 to define the sidewalls 114 and 116 of the magnetic structure 100. Because ion beam milling or an analogous process such as sputter etching is used in defining the magnetic structure 100, artifacts remain. Because FIG. 4C is not drawn to scale, it is possible to see examples of such artifacts 130, 132, 134, and 136. The artifacts include redeposition 130 and 134 as well as fencing 132 and 136. The redeposition 130 and 134 are generally at least twenty-five Angstroms thick. The fencing 132 and 136 is generally at least one hundred Angstroms thick.

Figure 4D:
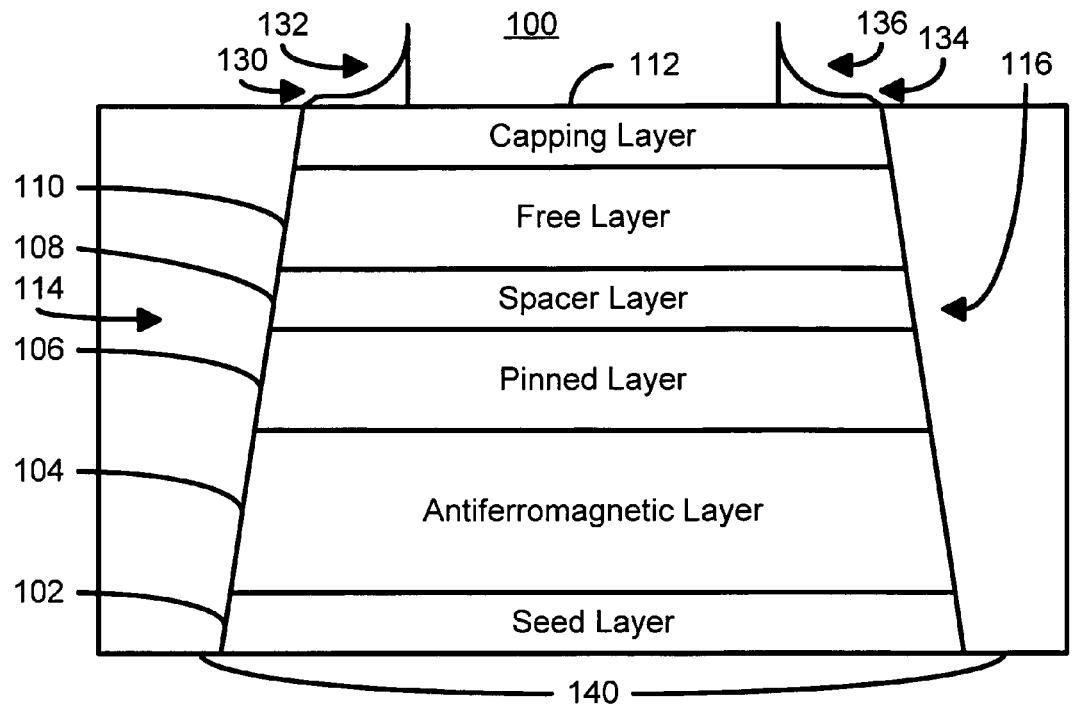

FIG. 4D depicts the magnetic structure 100 after lift off of the mask 120 and refilling using materials 140. The materials 140 preferably include at least one of alumina, an oxide, a nitride, and tungsten. In another embodiment, the materials 140 include a hard magnetic material. However, other materials may be used for the materials 140. The materials 140 at least encapsulate the sidewalls 114 and 116 of the magnetic structure 100. A portion of the materials 140 may also cover the artifacts 130, 132, 134, and/or 136.

Figure 4E:
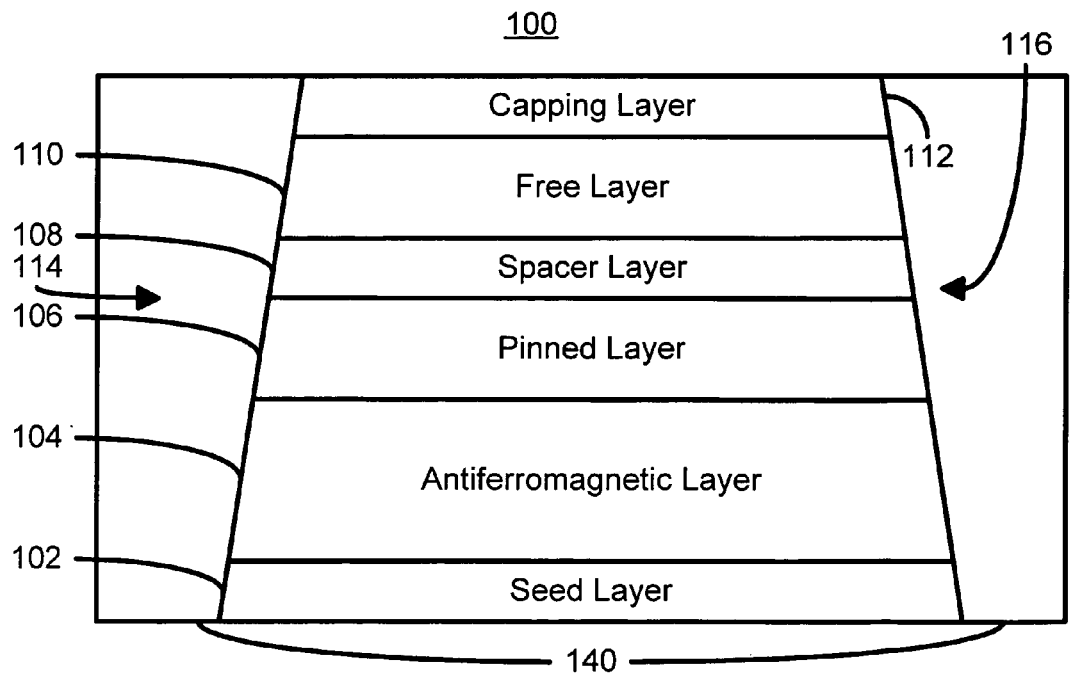

FIG. 4E depicts the magnetic structure 100 after cleaning using an isotropic carbonyl RIE. In an exemplary embodiment of the present invention, the isotropic carbonyl RIE is repeated, alternating with periods of exposure to oxygen plasma. The artifacts 130, 132, 134, and 136 include materials, such as Ni and Fe, that form carbonyls and are sensitive to carbonyl etches. Because an isotropic carbonyl RIE has been performed, the artifacts 130, 132, 134, and 136 have been reduced in size or removed. For example, the redeposition 130 and 134, which were on the order of twenty-five or more Angstroms in thickness, have been reduced in size to not more than fifteen Angstroms in thickness. Similarly, the fencing 132 and 136, if previously present, has been reduced in size or eliminated. Because the materials 140 encapsulate the sidewalls 114 and 116, damage to the sidewalls 114 and 116 of the magnetic structure 100 during the cleaning may be avoided. The top layer 112 also prevents the magnetic structure 100 from being damaged during the isotropic carbonyl RIE because it is relatively insensitive to the isotropic carbonyl RIE. For example carbonyls are not formed by Ta or Ta oxide, allowing one embodiment of the top layer 112 to be insensitive to the isotropic carbonyl RIE. Further, because the carbonyl etch is isotropic, the artifacts 130, 132, 134, and 136 may be removed substantially evenly in both perpendicular and in plane directions.

Figure 4F:
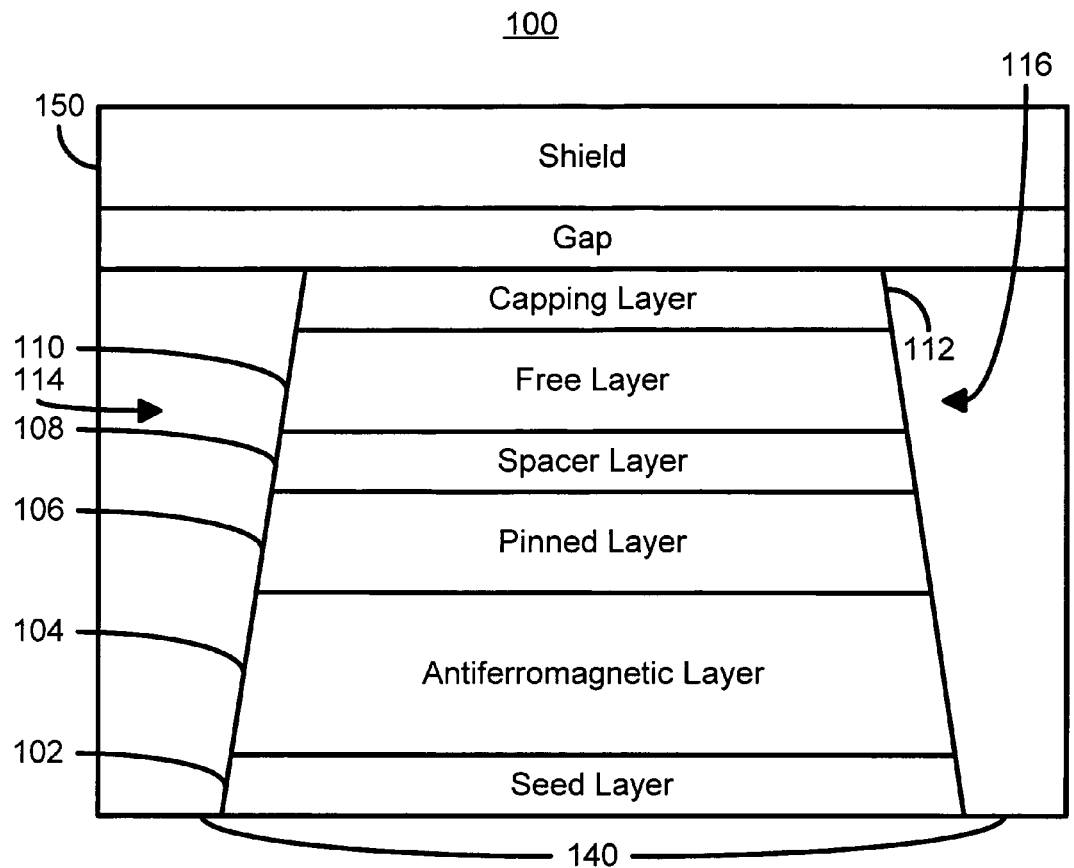

FIG. 4F depicts the magnetic structure 100 after processing is completed. Thus, an insulating gap 150 and a shield 160 have been provided. Note that especially for another embodiment in which the magnetic structure 100 is other than a spin valve, completing the processing may include forming other structures.

Thus, the magnetic structure 100 has been defined using a process, such as ion beam milling, that may result in artifacts 130, 132, 134, and/or 136. However, because of the isotropic carbonyl RIE, the artifacts 130, 132, 134, and/or 136 may be reduced or eliminated, even if they are formed on the sidewalls 114 and 116. As a result, the spacing between the magnetic structure 100 and other structures, such as the shield 150, may be less subject to variation. Consequently, shorting between the magnetic structure 100 and the shield may be reduced. Further, reduction or removal of the artifacts 130, 132, 134, and/or 136 may result in reduced shunting of current away from the sensing layers 106, 108, and 110 of the magnetic structure 100. Furthermore, if the magnetic structure 100 is a tunneling magnetoresistive junction, removal of the artifacts 130, 132, 134, and/or 136 may result in reduced variation of the contact area between leads and the tunneling magnetoresistive junction. If the artifacts 130, 132, 134, and/or 136 reside on the sidewalls 114 and 116, then their removal further reduces the possibility of shorting between the layers of the magnetic structure 100 and improves the reliability of the tunneling magnetoresistive junction. In addition, although the artifacts 130, 132, 134, and 136 have been described in the context of redeposition and fencing, other artifacts including but not limited to debris, might be cleaned using the method and system in accordance with the present invention. Consequently, performance and reliability of the magnetic structure 100 may be improved.

Figure 5:
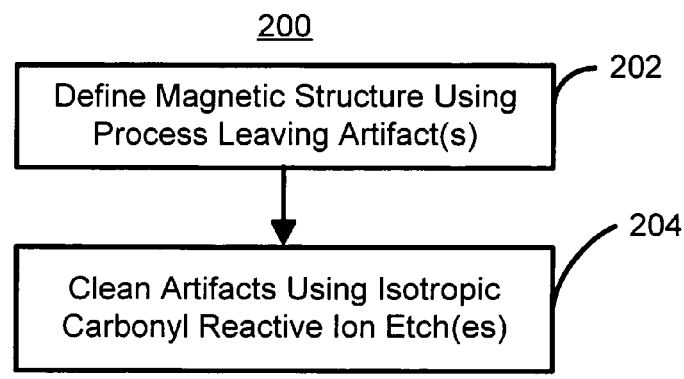
FIG. 5 is a high-level flow chart depicting a method in accordance with an exemplary embodiment of the present invention.

FIG. 5 is a high-level flow chart depicting a method 200 in accordance with an exemplary embodiment of the present invention. The method 200 is described in the context of the magnetic structure 100, a spin valve. However, the method 200 could be used for other magnetic structures (not shown). The method 200 preferably commences after the layers 102, 104, 106, 108, 110, and 112 of the magnetic structure 100 have been fabricated.

The magnetic structure 100, which has a top layer 112 that is insensitive to a carbonyl ME, is defined, via step 202. In a preferred embodiment, the defining of step 202 is performed using ion beam milling, or another analogous process. The defining performed in step 202 thus results in artifact(s) such as the artifacts 130, 132, 134, and/or 136.

The artifact(s) are cleaned using at least one isotropic carbonyl RIB, via step 204. The isotropic carbonyl RIE is termed "isotropic" because the etch removes a particular material at substantially the same rate in both horizontal and vertical directions. In one embodiment, step 204 includes multiple isotropic carbonyl RIEs. In such an embodiment, each isotropic carbonyl RIE is separated from another isotropic carbonyl RIE by a period of exposure to oxygen plasma. In one embodiment, this may be accomplished by shutting off carbon monoxide gas flow, flowing oxygen gas, and forming an oxygen plasma. In a preferred embodiment, the total time for the isotropic carbonyl RIE(s) does not exceed two thousand seconds. Also in a preferred embodiment, the total time for the isotropic carbonyl RIE(s) is at least five hundred seconds and not more than one thousand six hundred seconds. In addition, each isotropic carbonyl RIE is preferably between one hundred and two hundred seconds in duration.

A carbonyl RIE performed in step 204 is made isotropic by controlling the combination of the substrate bias voltage and the gas flow. The substrate bias voltage is the voltage applied to the substrate on which the magnetic structure 100 is fabricated. A low substrate bias voltage is preferred. In a preferred embodiment, the substrate bias voltage preferably does not exceed one hundred volts. More particularly, the substrate bias voltage is preferably between fifteen and seventy volts. The low substrate bias voltage reduces the acceleration of ions in the plasma used for the isotropic carbonyl RIE toward the substrate. Consequently, the paths of the ions are less likely to be straight (perpendicular to the plane of the layers 102, 104, 106, 108, 110, and 112) toward the magnetic element 100, allowing more material to be removed laterally.

Thus, the carbonyl RIE is made more isotropic. The flow of the CO and $NH_3$ gases is also controlled. In a preferred embodiment, the CO gas flow is set to at least eight sccm, and the $NH_3$ gas flow is set to at least ten sccm. More particularly, the CO gas flow is set to between ten and fifteen sccm, and the $NH_3$ gas flow is set to between fifteen and twenty sccm.

Using the method 200, the magnetic structure 100 can be fabricated. Because the isotropic carbonyl RIE is used, artifacts due to defining the magnetic element 100 can be removed. Thus, a preferred process, such as ion beam milling can be used to define the magnetic structure 100 despite artifacts introduced by the process. If artifacts can be effectively removed, then processes such as ion beam milling might have more utility for other magnetic structures and applications, such as tunneling magnetoresistive junctions and magnetic random access memories, in which shorting can be catastrophic.

Figure 6:
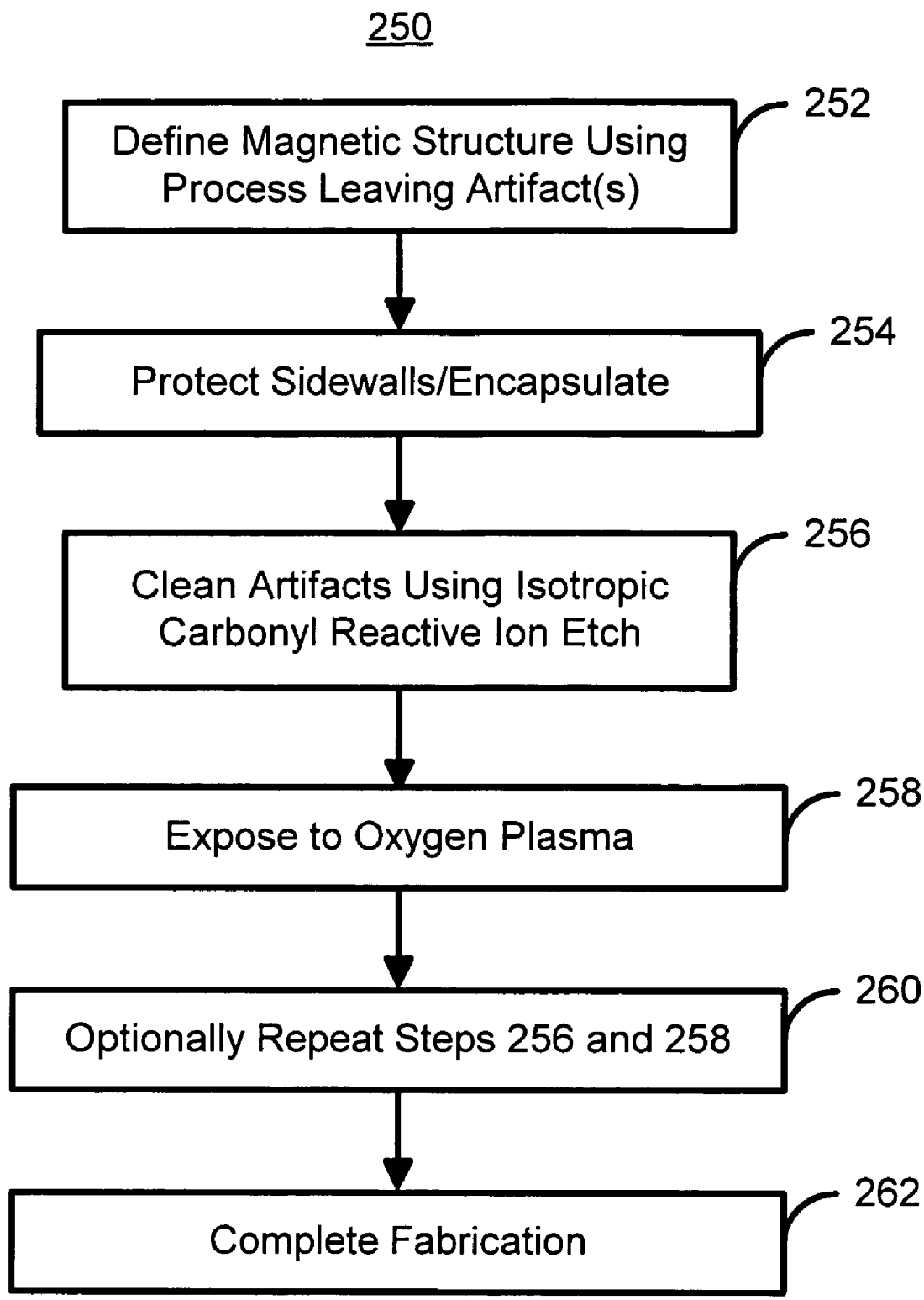
FIG. 6 is a flow chart depicting a method for providing a magnetic structure in accordance with an exemplary embodiment of the present invention.

FIG. 6 is a more detailed flow chart depicting a method 250 for providing a magnetic structure in accordance with an exemplary embodiment of the present invention. The method 250 is described in the context of the magnetic structure 100, a spin valve. However, the method 250 could be used for other magnetic structures (not shown). The method 250 preferably commences after the layers 102, 104, 106, 108, 110, and 112 of the magnetic structure 100 have been fabricated.

The magnetic structure 100, which has a top layer 112 that is insensitive to an isotropic carbonyl RIB, is defined, via step 252. Step 252 is analogous to step 202 of the method 200. Thus, the defining of step 252 is preferably performed using ion beam milling, or another analogous process such as sputter etching. The defining performed in step 252 results in artifact(s) such as the artifacts 130, 132, 134, and/or 136.

The sidewalls 114 and 116 of the magnetic structure 100 are protected, preferably by encapsulating at least a portion of the magnetic structure 100, via step 254. In a preferred embodiment, step 254 includes encapsulating a portion of the magnetic structure 100 in an insulator or a hard magnet. The artifact(s) are cleaned using an isotropic carbonyl RIB, via step 256. The isotropic carbonyl RIE is terminated and the device is exposed to an oxygen plasma a period, via step 258. Also in a preferred embodiment, the exposure to the oxygen plasma in step 258 preferably has a duration of between thirty and sixty seconds, though may be as low as fifteen seconds. The isotropic carbonyl RIE is repeated a desired number of times, with each isotropic carbonyl RIE separated by periods of exposure to oxygen plasma, via step 260. Stated differently, steps 256 and 258 are repeated a desired number of times. In a preferred embodiment, the total time for the isotropic carbonyl RIEs does not exceed two thousand seconds. Also in a preferred embodiment, the total time for the isotropic carbonyl RIE(s) is at least five hundred seconds and no more than one thousand six hundred seconds. The carbonyl RIE(s) performed in steps 256 and 260 are made isotropic by controlling the combination of the substrate bias voltage and the gas flow, as discussed above. Processing is then completed, via step 262. Thus, other structures such as insulating gaps and shields, if desired, are fabricated. In addition, step 262 could include repeating some or all of steps 252-260 to clean artifacts again.

Using the method 250, the magnetic structure 100 can be fabricated. Because the isotropic carbonyl RIE is used, artifacts due to defining the magnetic element 100 may be removed. Thus, a preferred process, such as ion beam milling can be used to define the magnetic structure 100 despite artifacts introduced by the process. If artifacts can be effectively removed, then processes such as ion beam milling might have more utility for other magnetic structures and applications, such as tunneling magnetoresistive junctions and magnetic random access memories.

We claim:

1. A method for manufacturing a magnetic structure comprising:
    defining the magnetic structure including at least one magnetic material to form a defined magnetic structure, the magnetic structure including a capping layer that is insensitive to an isotropic carbonyl reactive ion etch and a magnetic layer including the at least one magnetic material under the capping layer, the defining including removing a portion of the capping layer and a portion of the magnetic layer, the defining resulting in at least one artifact on at least the capping layer of the defined magnetic structure; and
    performing at least one isotropic carbonyl reactive ion etch to remove the at least one artifact from the defined magnetic structure, the performing the isotropic carbonyl reactive ion etch further including forming a plasma from gases including CO gas and $NH_3$ gas.

2. The method of claim 1 further comprising:
    exposing at least a portion of the defined magnetic structure to an oxygen plasma for a period.

3. The method of claim 2 wherein each of the at least one isotropic carbonyl reactive ion etch has a duration of at least one hundred seconds and no more than two hundred seconds.

4. The method of claim 3 wherein the at least one isotropic carbonyl reactive ion etch is repeated more than once.

5. The method of claim 4 wherein the at least one isotropic carbonyl reactive ion etch is repeated few enough times such that a sum of the duration of all of the at least one isotropic carbonyl reactive ion etch is no more than two thousand seconds.

6. The method of claim 5 wherein the sum is at least three hundred seconds.

7. The method of claim 2 wherein each period of exposure to the oxygen plasma has a duration of at least fifteen seconds and no more than sixty seconds.

8. The method of claim 1 wherein the magnetic structure includes side walls, the method further including:
    protecting the side walls from exposure to the carbonyl reactive ion etch prior to cleaning the artifacts using the at least one isotropic carbonyl reactive ion etch.

9. The method of claim 8 wherein the protecting further includes:
    encapsulating a portion of the magnetic structure in an encapsulation material, the portion of the magnetic structure including the sidewalls.

10. The method of claim 9 wherein the encapsulation material includes at least one of an insulator and a nonmagnetic metal.

11. The method of claim 10 wherein the encapsulation material includes at least one of alumina, an oxide, a nitride, and tungsten.

12. The method of claim 9 wherein the encapsulation material includes a hard magnetic material.

13. The method of claim 1 wherein the capping layer includes at least one of Ta, W, and Ti.

14. The method of claim 13 wherein the capping layer includes oxidized Ta.

15. The method of claim 1 wherein the magnetic structure is formed on a substrate and wherein the performing step further includes:
    setting a substrate bias voltage for the substrate to not more than one hundred volts.

16. The method of claim 15 wherein the providing step further includes:
   setting the substrate bias voltage to between ten and seventy volts.

17. The method of claim 1 wherein the performing further includes:
   setting the CO gas flow to at least eight sccm; and
   setting the $NH_3$ gas flow to at least ten sccm.

18. The method of claim 17 wherein the performing further includes:
   setting the CO gas flow to between ten and fifteen sccm; and
   setting the $NH_3$ gas flow to between fifteen and twenty sccm.

19. The method of claim 1 wherein the defined magnetic structure is a magnetoresistive element.

20. The method of claim 19 wherein the defining further includes:
   ion milling a plurality of layers of the magnetoresistive element.

21. The method of claim 19 wherein the magnetoresistive element is a spin valve.

22. The method of claim 1 wherein the magnetic structure resides in a magnetic head.

23. The method of claim 1:
   wherein the at least one artifact includes redeposition of the at least one magnetic material.

24. The method of claim 1 wherein the at least one artifact includes fencing.

25. The method of claim 1 wherein the at least one artifact includes debris.

26. The method of claim 1 wherein the defined magnetic structure is a tunneling magnetoresistive junction.

27. The method of claim 1 wherein the magnetic structure resides in a magnetic random access memory.

28. A method for manufacturing a magnetic structure including at least one magnetic layer and formed on a substrate, the method comprising:
   defining the magnetic structure utilizing at least one of ion milling and sputter etching, the magnetic structure including a top layer that is insensitive to an isotropic carbonyl reactive ion etch, the defining including defining the at least one magnetic layer and resulting in at least one artifact on the magnetic structure; and
   performing at least one isotropic carbonyl reactive ion etch to remove the at least one artifact, the performing the isotropic carbonyl reactive ion etch further including forming a plasma from CO gas and $NH_3$ gas, the at least one isotropic carbonyl reactive ion removing the at least one artifact substantially equally in a vertical direction and a horizontal direction, the at least one isotropic carbonyl reactive ion etch including
   setting a first flow rate for the CO gas, a second flow rate for the $NH_3$ gas, and a substrate bias voltage such that the carbonyl reactive ion etch is isotropic.

29. The method of claim 1 wherein the gases consist essentially of CO and $NH_3$.

30. The method of claim 1 wherein the at least one isotropic carbonyl reactive ion etch removes the at least one artifact substantially equally in a vertical direction and a horizontal direction.

* * * * *